United States Patent [19]

Moslehi

[11] Patent Number: 5,373,184
[45] Date of Patent: Dec. 13, 1994

[54] SOI/SEMICONDUCTOR HETEROSTRUCTURE FABRICATION BY WAFER BONDING

[75] Inventor: Mehrdad M. Moslehi, Dallas, Tex.

[73] Assignee: Texas Instruments Incorporated, Dallas, Tex.

[21] Appl. No.: 64,332

[22] Filed: May 19, 1993

Related U.S. Application Data

[60] Continuation of Ser. No. 815,993, Jan. 2, 1992, abandoned, which is a division of Ser. No. 633,647, Dec. 20, 1990, Pat. No. 5,102,821.

[51] Int. Cl.[5] .................... H01L 29/06; H01L 29/04; H01L 27/12; H01L 27/02
[52] U.S. Cl. .................................. 257/499; 257/616; 257/618; 257/754; 257/768
[58] Field of Search ............... 357/55, 59, 4; 257/499, 257/616, 618, 754, 768

[56] References Cited

PUBLICATIONS

IEDM Digest, Dec. 1985, pp. 684–687, by Lashy et al.
IEEE Electron Devices Society Program of Annual Conference, Jun. 1988, by Arimoto et al. vol. 28, #8, pp. 1426–1443, by Haisma et al. Aug. 1989.
Fujitsu Sci. Tech. Journal, vol. 24, #4, pp. 408–417 by Gotou et al., Dec. 1988.

Primary Examiner—Mark V. Prenty
Attorney, Agent, or Firm—Dana L. Burton; Richard L. Donaldson

[57] ABSTRACT

This is a method of forming a semiconductor-on-insulator wafer from two individual wafers. The method comprises: forming a layer of metal (e.g. titanium 24) on a first wafer; forming an insulator (e.g. oxide 32) on a second wafer; forming a bonding layer (e.g. poly 38) over the insulator; anisotropically etching the bonding layer forming chambers in the bonding layer; stacking the first and second wafers with the metal against the second wafer's bonding layer; forming a chemical bond between the metal layer and the bonding layer (e.g. between the titanium 20 and the poly 38) in a vacuum chamber, thereby creating micro-vacuum chambers (42) between the wafers; selectively etching the second wafer to form a thin semiconductor layer ( e.g. epi layer 30). This is also a semiconductor-on-insulator wafer. The wafer comprises: a substrate (e.g. semiconductor substrate 20); a layer of metal (e.g. titanium 24) and semiconductor ( e.g. silicide 40) over the substrate; a bonding layer (e.g. poly 38) over the metal and semiconductor, with micro-vacuum chambers (42) in the bonding layer; an insulator (e.g. oxide 32) over the bonding layer; and a single-crystal semiconductor layer (e.g. epi layer 30) over the insulator.

10 Claims, 3 Drawing Sheets

SOI/SEMICONDUCTOR HETEROSTRUCTURE FABRICATION BY WAFER BONDING

This application is a continuation of application Ser. No. 07/815,993 filed Jan. 2, 1992 and now abandoned, which is a divisional of application Ser. No. 07/633,647 filed Dec. 20, 1990 and now U.S. Pat. No. 5,102,821.

NOTICE (C) Copyright, *M* Texas Instruments Incorporated 1990. A portion of the disclosure of this patent document contains material which is subject to copyright and mask work protection. The copyright and mask work owner has no objection to the facsimile reproduction by anyone of the patent document or the patent disclosure, as it appears in the Patent and Trademark Office patent file or records, but otherwise reserves all copyright and mask work rights whatsoever.

FIELD OF THE INVENTION

This invention generally relates to semiconductor fabrication methods and devices, and more specifically to semiconductor on insulator (SOI) and heterostructure semiconductor fabrication methods and devices.

BACKGROUND OF THE INVENTION

SOI technologies have been investigated extensively for a number of applications including rad-hard devices, high-performance high-speed IC's, and 3-D integrated devices. SOI formation may be done by several different wafer bonding techniques. These techniques employ various bonding methods such as annealing, mechanical pressing and annealing, or electric-field pressing and annealing. Various interlayer insulators such as thermal $SiO_2$ and doped oxide have been used. Typical wafer bonding processes, based on the Van der Waals forces require extremely flat, particle free and defect free surfaces. After the two wafers are bonded together, various thinning methods may be used on the active SOI layer.

One bonding method employs a thin layer of metal, such as Ti or Al, between two nitride layers, on two wafers, which are then pressed together. A bonding by glass layer fusing technique bonds two glass layers with low softening/flow temperature. This technique, however, has been based on alkali lead borosilicate spin-on glass which can contaminate the wafer. A technique has been developed for direct bonding of Si wafers. The bonding process employs contacting of hydrogenated Si on $SiO_2$ surfaces, which are flat with a high surface finish, and an anneal step above 900° C. in an oxidizing ambient. In a process using Van der Waals forces and chemical bonding, two oxidized wafers are contacted after cleaning in an aqueous environment. As a result, the oxidized surfaces will contain SiOH groups on which additional water molecules are bonded by hydrogen bonding. The resultant Van der Waals forces are about $10^6 N/M^2$ between two 100 mm wafers. The wafer pair is then annealed at 1050°-1150° C. This results in a chemical reaction at the interface. The Van der Waals forces are converted to much stronger chemical bonds. The soot bonding process employs the following steps: spraying Si-B-O soot generated by a flame hydrolysis reaction, positioning a support substrate, and sintering. The soot particles are sprayed against heated grooved substrates. The surface of the deposited layer becomes almost flat because of selective filling of grooves. The active substrate is placed against a holding substrate and heat treated.

Generally, conventional wafer bonding techniques require particle-free surfaces, surface flatness and polish, and most require high temperature anneal steps (e.g. 1000°-1280° C.).

SUMMARY OF THE INVENTION

This is a method of forming a semiconductor-on-insulator wafer from two individual wafers. Preferably the method comprises: making a first wafer by forming a first oxide layer on a substrate; forming a layer of titanium on the first oxide layer; making a second wafer by epitaxially forming a first epi layer on an active single-crystal semiconductor substrate with the first epi layer having a different doping than the semiconductor substrate; epitaxially forming a second epi layer, on the first epi layer, of different doping than the first epi layer; forming a second oxide layer on the second epi layer; forming a nitride layer on the second oxide layer; forming a third oxide layer on the nitride layer; forming a polycrystalline silicon (poly) layer on the nitride layer; anisotropically etching the poly layer forming chambers in the poly layer; stacking the first wafer's titanium metal adjacent to the second wafer's poly layer; merging the first and second wafers to form a chemical bond between the titanium layer and the poly layer, thereby creating micro-vacuum chambers between the wafers; selectively etching the semiconductor substrate layer to reveal the first epi layer; and selectively etching the first epi layer to reveal the second epi layer.

More generally the method comprises: forming a layer of metal on a first wafer; forming an insulator on a second wafer; forming a bonding layer over the insulator; anisotropically etching the bonding layer forming chambers in the bonding layer; stacking the first and second wafers with the metal against the second wafer's bonding layer; forming a chemical bond between the metal layer and the bonding layer in a vacuum chamber, thereby creating micro-vacuum chambers between the wafers; selectively etching the second wafer to form a thin semiconductor layer.

Preferably the insulator is of oxide; a diffusion resistant layer is utilized adjacent to the oxide and the diffusion resistant layer is nitride; the metal is a refractory metal, preferably titanium; the bonding layer is polycrystalline silicon, amorphous silicon, germanium, or silicon germanium; and the semiconductor is silicon. Also, the second wafer is preferably made by epitaxially forming an epi layer on a semiconductor substrate, with the epi layer having a different doping than the semiconductor substrate, prior to forming the insulator.

This is also a semiconductor-on-insulator wafer. The wafer comprises: a semiconductor substrate; a layer of metal and semiconductor over the substrate; a bonding layer over the metal and semiconductor, with evacuated chambers in the bonding layer; an insulator over the bonding layer; and a single-crystal semiconductor layer over the insulator.

DETAILED DESCRIPTION OF PREFERRED EMBODIMENTS

Figure 1:
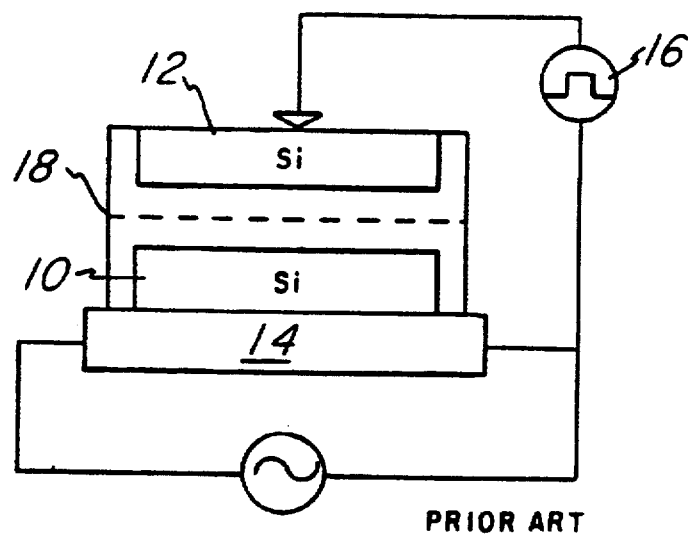
FIG. 1 is a view of a prior art SOI wafer formed by a pulse field assisted wafer bonding process.

FIG. 1 shows an example of a prior art semiconductor-on-insulator (SOI) wafer formed by a pulse field assisted wafer bonding process. The pulse-field-assisted bonding method bonds two oxidized wafers 10,12 using a carbon heater 14 at $10^{-1}$ pa while applying a pulsed voltage 16 to provide an electrostatic force. The typical bonding temperature is 800° C. The pulsed voltage 16 is used in order to prevent electrical breakdown of the inter-layer insulator 18. After bonding, the combined wafer is annealed at 1100° C. for 30 minutes to increase the bonding strength.

Figure 2A:
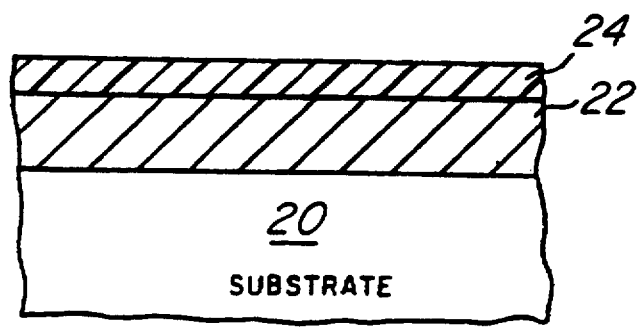
FIGS. 2a-f are views of a preferred embodiment of this invention, during sequential processing steps, in which an SOI wafer is formed using a wafer bonding process.
Figure 2B:
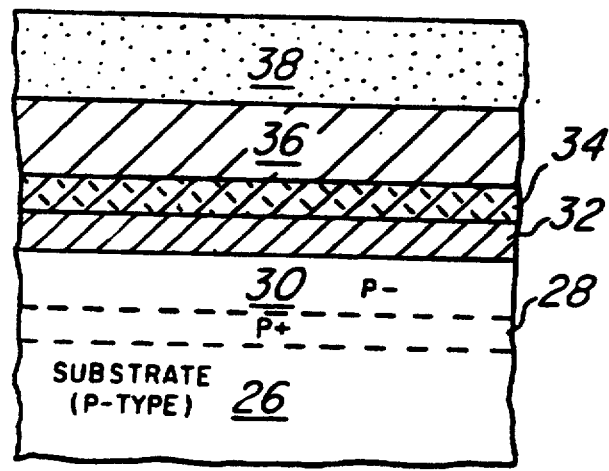
Figure 2C:
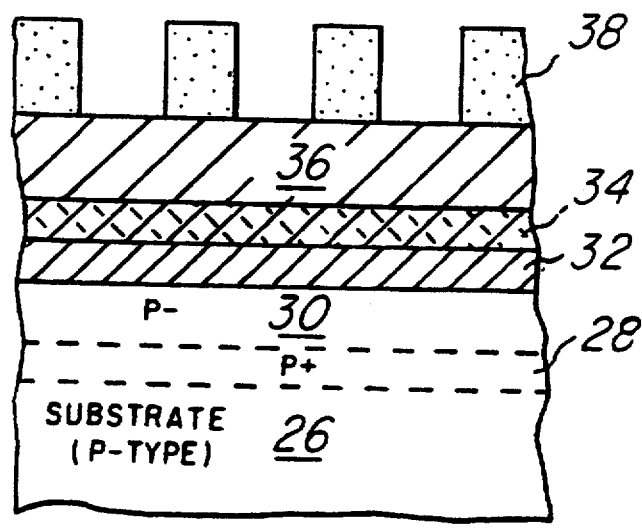
Figure 2D:
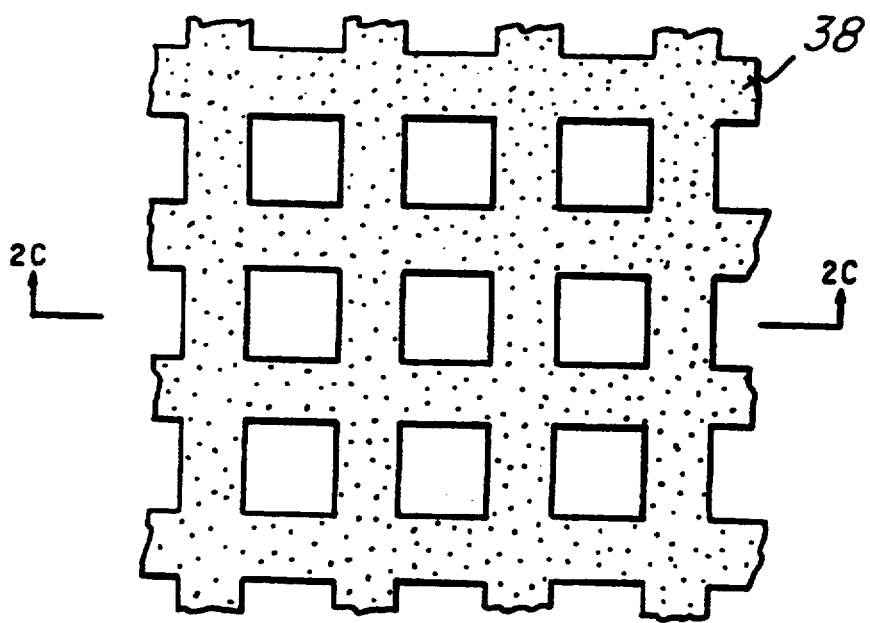
Figure 2E:
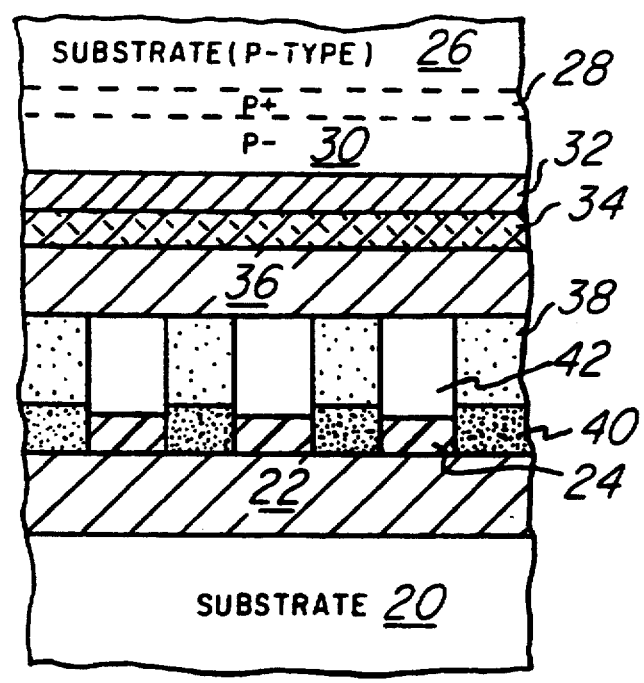
Figure 2F:
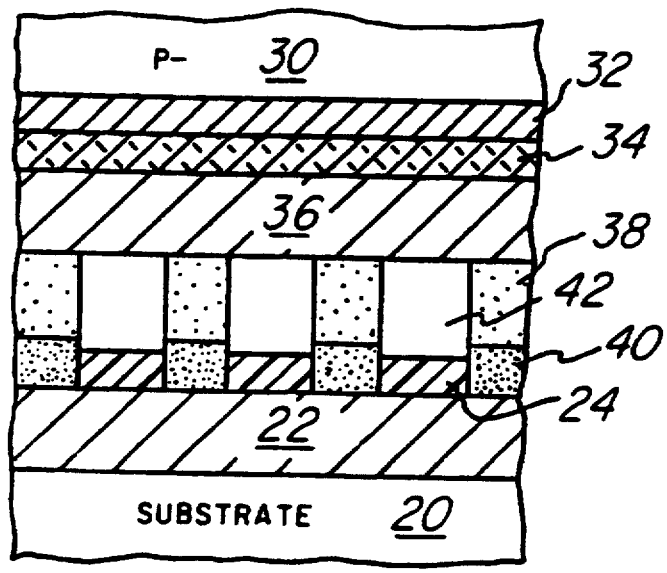

A preferred embodiment of the present invention is shown in FIG. 2f. A method of making this preferred embodiment SOI wafer, using a wafer bonding process, will be described with reference to FIGS. 2a-2f. Initially, two wafers are formed. The first, shown in FIG. 2a, has a silicon substrate 20 upon which a layer, approximately 1 um thick, of oxide 22, preferably TEOS oxide, is formed. A layer of titanium 24, approximately 2500Å thick, is formed, by a process such as sputtering or chemical vapor depletion, over the layer of oxide 22. The second wafer, shown in FIG. 2b, begins with a p− silicon substrate 26, with an epitaxially formed buried p+ layer 28 under an epitaxially formed p− layer 30 (this portion will later contain the active circuit). Both the substrate 26 and epi layers 28,30 are shown as p type, however, they could alternately be n type. A layer of oxide 32 followed by a layer of nitride 34, each approximately 1000Å thick, are formed on the epi wafer. An optional oxide layer 36, such as TEOS oxide, approximately 1-2 um may be formed to increase the strength and prevent bowing of the final structure. The second wafer is completed by forming a layer of polycrystalline silicon (poly) 38, approximately 2 um thick.

A masking step is performed on the poly 38 of wafer 2 (FIG. 2b) to generate a grid pattern of poly lines 38, approximately 2 um wide and 4 um apart, using an anisotropic poly etch. FIG. 2c shows a cross-sectional view of the wafer after the poly 38 is etched. FIG. 2d is a top level view showing the etching pattern in the poly 38 described above. The grid pattern is not the only etching pattern which may be used. It is, however, an optimal method to obtain the benefits of the final structure.

The two wafers are then stacked together, with the second wafer inverted and on top of the first wafer, in an annealing chamber capable of low-pressure RF plasma processing. Pulsed voltage is applied between the heated wafer chuck and plasma while heating the stack to 700°-800° C. The process is performed at a pressure less than i Torr in Argon. The process results in the formation of TiSi$_2$ 40 where the poly beams 38 of the second wafer and the titanium layer 24 of the first wafer meet, creating a very strong chemical bond between the two wafers. As a result, micro-vacuum chambers 42 are formed between the two wafers, which enhances the bond. The resultant structure is shown in FIG. 2e.

The thick p− substrate region 26 on the active side of the SOI wafer is then selectively etched to stop on the buried p+ etch stop layer 28, followed by another selective etch of the p+ region 28 which stops on the p− 30 active SOI film, shown in FIG. 2f.

There are several advantages of the wafer bonding SOI technique of this invention. Wafer bonding is achieved at fairly low temperatures via silicide formation between a sputtered metal and an undoped poly layer. The bonding can be done in an Argon, or another inert, plasma environment to allow electrostatic pulsing attraction of the two wafers by applying a pulsed voltage between the wafer chuck and the opposite plasma electrode. If desired, mechanical pressing may be used instead of pulsed voltage or pulsed plasma pressing. The use of a grid pattern makes the bonding process much more tolerant of particulates and allows formation of micro-vacuum chambers. Moreover, the chemical bonding process, based on silicide formation, provides very strong bonding forces due to intermixing of two layers (poly, Ti) on two stacked wafers. The micro-vacuum chambers formed by the bonded grid pattern provide additional bonding forces and reduced capacitance coupling to the substrate.

A preferred embodiment has been described in detail hereinabove. It is to be understood that the scope of the invention also comprehends embodiments different from those described, yet within the scope of the claims. For example, while the substrates used are referred to as silicon, one or both could be any other appropriate semiconductor material. Similarly, the oxide could be replaced with any other insulator, the nitride could be replaced with any material that will act as a diffusion layer, the titanium could be replaced with any suitable metal, and the poly could be replaced with any material, such as germanium, that will chemically bond with the metal used on the surface of the other wafer. The wafers are preferably bonded by the method described, however, it is not the only possible method. For example, the plasma environment is not necessary for bonding (e.g., if desired, the wafers may simply be mechanically pressed).

The wafer bonding technique proposed here is also applicable to hybrid semiconductor wafers. For instance, it is possible to employ the silicide bonding method to fabricate GaAs-ON-Si, Ge-ON-Si, and other stacked semiconductor materials. This technique is a viable alternative to the MOCVD and MBE techniques for these applications. As a result, it is possible to combine any two (or more) semiconductor materials irrespective of their lattice mismatch (the conventional epitaxial growth techniques are only capable of growing closely matched layers on a given semiconductor substrate such as Si).

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor-on-insulator wafer; said wafer comprising:
   a. a substrate;
   b. a metal layer over said substrate;
   c. a silicon bonding layer over said metal layer, comprising pillars, wherein portions of said metal layer and portions of said pillars are chemically bonded such that said portions of said metal layer and said portions of said pillars are not separately distinguishable;
   d. evacuated chambers between said pillars;

e. an insulator over said bonding layer; and f. a semiconductor layer over said insulator.

2. The wafer of claim 1, wherein said insulator is oxide.

3. The wafer of claim 2, wherein a diffusion resistant layer is adjacent to said oxide.

4. The wafer of claim 3, wherein said diffusion resistant layer is nitride.

5. The wafer of claim 1, wherein said metal is a refractory metal.

6. The wafer of claim 5, wherein said refractory metal is titanium.

7. The wafer of claim 1, wherein said semiconductor layer is silicon.

8. The wafer of claim 1, wherein said semiconductor layer contains at least two sublayers having different dopant levels.

9. The wafer of claim 1, wherein said substrate is silicon.

10. The wafer of claim 1, wherein an insulating layer is between said substrate and said metal layer.

* * * * *